United States Patent
Lee et al.

(10) Patent No.: US 9,455,202 B2
(45) Date of Patent: Sep. 27, 2016

(54) MASK SET AND METHOD FOR FABRICATING SEMICONDUCTOR DEVICE BY USING THE SAME

(71) Applicant: UNITED MICROELECTRONICS CORP., Hsin-Chu (TW)

(72) Inventors: Wei-Chi Lee, Tainan (TW); Yu-Lin Wang, Tainan (TW); Chung-Yuan Lee, Taoyuan County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/289,657

(22) Filed: May 29, 2014

(65) Prior Publication Data
US 2015/0348850 A1    Dec. 3, 2015

(51) Int. Cl.
*H01L 21/8238* (2006.01)
*G03F 1/00* (2012.01)

(52) U.S. Cl.
CPC ......... *H01L 21/823842* (2013.01); *G03F 1/00* (2013.01)

(58) Field of Classification Search
USPC .......................................................... 430/5
See application file for complete search history.

(56) References Cited

U.S. PATENT DOCUMENTS

| | | | | |
|---|---|---|---|---|
| 8,377,826 B2* | 2/2013 | Kim | ................. | H01L 27/10876 257/212 |
| 8,642,451 B2* | 2/2014 | Chang | ................. | H01L 27/0207 257/E21.09 |
| 8,749,919 B2* | 6/2014 | Sasaki | ................. | G11B 5/1278 360/125.13 |
| 2002/0106567 A1* | 8/2002 | Fujimoto | ................. | G03F 1/30 430/5 |
| 2003/0008218 A1* | 1/2003 | Friedrich | ................. | G03F 1/30 430/5 |
| 2005/0019708 A1* | 1/2005 | Fujimoto | ................. | G03F 1/30 430/394 |
| 2005/0098815 A1* | 5/2005 | Okita | ................. | H01L 27/0629 257/306 |
| 2010/0167537 A1* | 7/2010 | Aton | ................. | G03F 1/144 438/674 |
| 2012/0147501 A1* | 6/2012 | Sasaki | ................. | G11B 5/1278 360/123.12 |
| 2012/0187525 A1* | 7/2012 | Abou-Khalil | ....... | H01L 27/0262 257/507 |
| 2015/0147850 A1* | 5/2015 | Stranzl | ................. | H01L 24/83 438/118 |

* cited by examiner

*Primary Examiner* — Alexander Ghyka
(74) *Attorney, Agent, or Firm* — Winston Hsu; Scott Margo (57) ABSTRACT

A mask set includes a first mask and a second mask. The first mask includes geometric patterns. The second mask includes at least a strip-shaped pattern with a first edge and a second edge opposite to the first edge. The strip-shaped pattern has a centerline along a long axis of the strip-shaped pattern. The first edge includes inwardly displaced segments shifting towards the centerline and each of the inwardly displaced segments overlaps each of the geometric patterns.

19 Claims, 8 Drawing Sheets

MASK SET AND METHOD FOR FABRICATING SEMICONDUCTOR DEVICE BY USING THE SAME

BACKGROUND OF THE INVENTION

1. Field of the Invention

The present invention relates generally to the field of memory devices, and more particularly to a mask set used to fabricate memory devices and a method for fabricating semiconductor devices by using the mask set.

2. Description of the Prior Art

In the past few decades, semiconductor devices have become more and more integrated and methods used to fabricate the semiconductor devices have been improved continuously. Among all of the factors relevant to the electrical properties of the semiconductor devices, the thickness and dielectric constant of the gate dielectric layer are the most influential ones. In detail, in order to keep or enhance the drift current in the semiconductor devices, high dielectric constant (hereinafter abbreviated as high-k) materials are often used to replace the conventional silicon oxide as the gate dielectric layer. The main advantage of adopting the high-k materials is that it decreases physical limit thickness, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus metal gates, which include metal gate electrodes and work function metals, are developed to replace the conventional polysilicon gate.

However, there is always a need in the semiconductor processing art to develop semiconductor device with superior performance and reliability. For example, there is a need to effectively fabricate complementary metal-oxide-semiconductor devices (CMOS) with metal gates, n-type work function metal layers, p-type work function metal layers and high-K gate dielectric layers.

SUMMARY OF THE INVENTION

To this end, a mask set is disclosed according to one embodiment of the present invention. The mask set includes a first mask and a second mask. The first mask includes geometric patterns. The second mask includes at least a strip-shaped pattern with a first edge and a second edge opposite to the first edge. The strip-shaped pattern has a centerline along a long axis of the strip-shaped pattern. The first edge includes inwardly displaced segments shifting towards the centerline and each of the inwardly displaced segments overlaps each of the geometric patterns.

A method for fabricating a semiconductor by using the mask set is also disclosed according to another embodiment of the present invention. The method includes the following steps. First, a substrate including fin structures is provided. Gate structures are then formed to cross the fin structures. The ends of the gate structures substantially align with edges of the geometric patterns of the mask set above. Afterwards, the strip-shaped pattern of the mask set above is transferred onto the substrate to thereby form at least a serpentine pattern on the substrate. The serpentine pattern includes inwardly curved portions and outwardly curved portions. The inwardly curved portions are spaced apart from the ends of the gate structures.

One feature of the present disclosure is that portions of the serpentine pattern are disposed more away from the ends of the gate structures than other portions of the serpentine pattern. If there is an alignment mismatch which causes the shift of the serpentine pattern, a buffer region provided by the inwardly curved portions may be used to reduce the influence of this alignment mismatch on fabrication processes. Therefore, a work function metal layer in a first region may still be removed completely even if there is an alignment mismatch of the serpentine pattern.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 1:
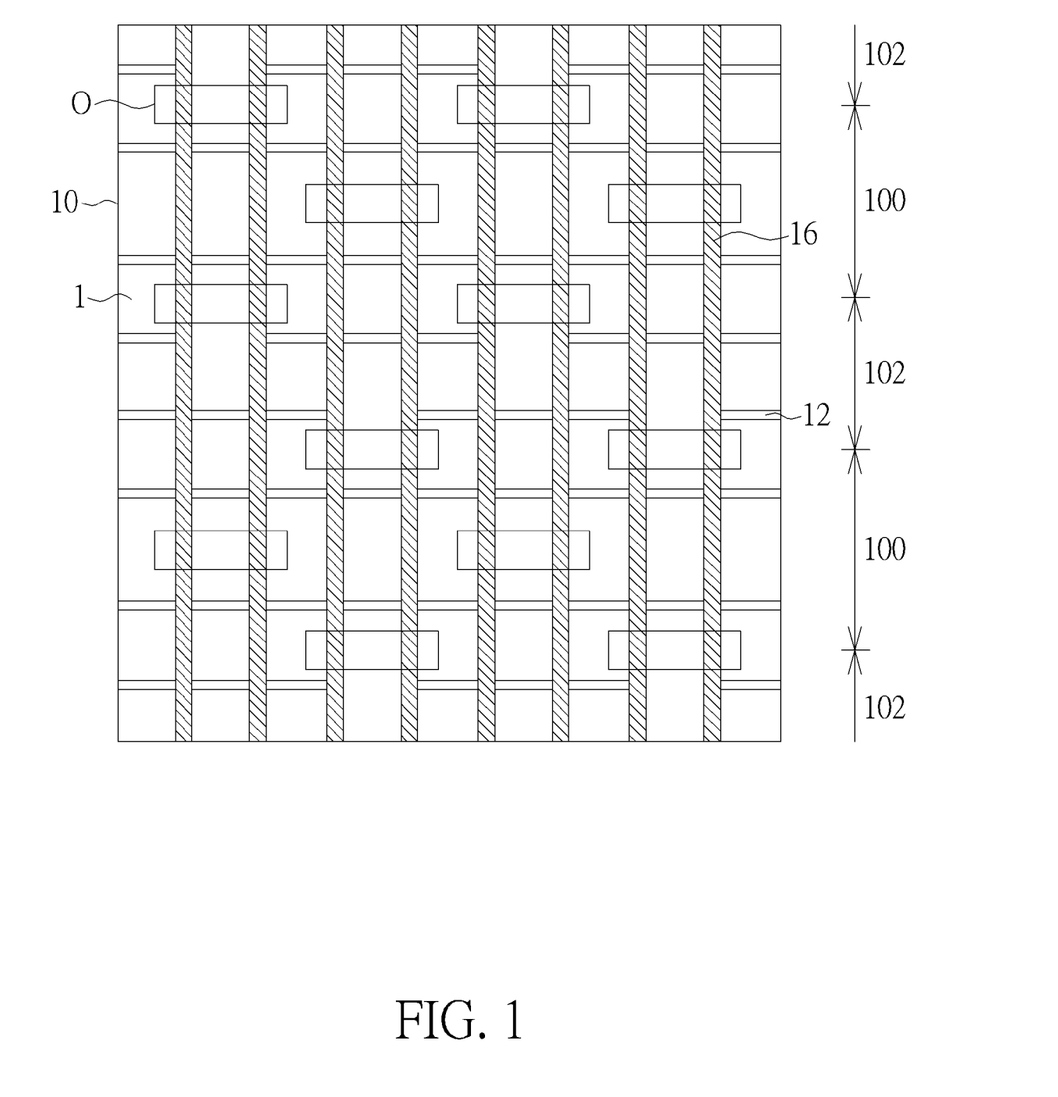
FIG. 1 is a schematic top view showing a semiconductor device at the beginning of the fabrication process.

Please refer to FIG. 1. FIG. 1 is a schematic top view showing a semiconductor device at the beginning of the fabrication process. A substrate 10 having fin structures 12 is provided. Stripe-shaped gate structures 16 are then formed on the substrate 10 to cross and cover portions of the fin structures 12. The gate structures 16 may be dummy gate structures composed of dummy gate electrodes which may be replaced with metal gate electrodes in the following processing steps. Afterwards, a photolithographic process is carried out to transfer geometric patterns, such as slot patterns, from a photomask (not shown) onto the substrate 10. As a result, openings O are formed in a photoresist 1 on the substrate 10 as shown in FIG. 1. Preferably, openings O are rectangles and are alternately disposed with one another. Portions of the gate structures 16 may be exposed from the openings O. It should be noted that, because the openings O are formed by transferring the geometric patterns of the photomask in the corresponding photolithographic process, the contours of the openings O are preferably similar to those of the geometric patterns of the photomask. Therefore, the geometric patterns are also rectangles and are alternately disposed on the photomask.

Figure 2:
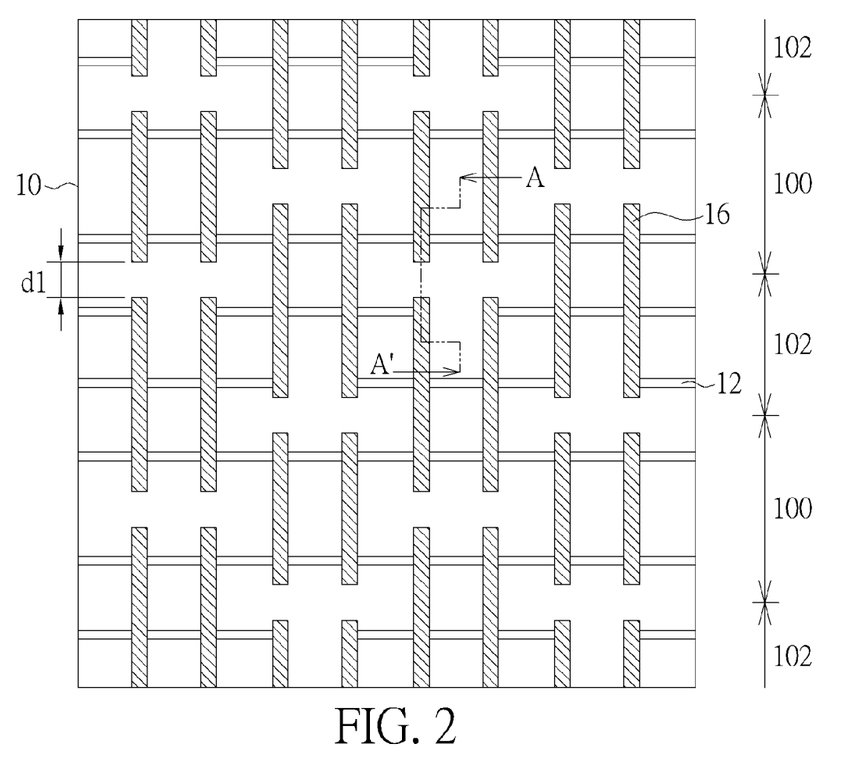
FIG. 2 is a schematic top view showing a semiconductor device after a cutting process.

Please refer to FIG. 2. Then, an etching process is carried out to remove the exposed portions of the gate structures 16 in order to form interrupted portions (not shown). The layout of the remained gate structures 16 is shown in FIG. 2. At this fabrication stage, the gate structures 16 are spaced apart from one another with end-to-end distances d1 (also called interrupted portions) and spacing (not shown). In detail, gate structures 16 are respectively disposed in a first region 100 and a second region 102. Preferably, the first region 100 is a region used to accommodate n-type semiconductor devices, such as n-type metal oxide semiconductor field effect transistors (MOSFET), while the second region 102 is a region used to accommodate p-type semiconductor devices, such as p-type MOSFET.

Subsequently, spacers (not shown) may be formed on the sidewalls of the gate structures 16, which may be used to define locations of source/drain regions (not shown) or lightly doped drain regions (not shown) of the semiconductor devices, but not limited thereto. Epitaxial layers (not shown) with compressive stress or tensile stress may be respectively formed in the first region 100 (i.e. NMOS region) or the second region 102 (i.e. PMOS region). The purpose of the epitaxial layers is to enhance the carrier mobility of the transistors fabricated in the following processes. Optionally, a contact etch stop layer (CESL) (not shown) may be formed to cover the spacers and/or the epitaxial layers, but not limited thereto. After the formation of the spacers, a dielectric layer (not shown), such as interlayer dielectric (ILD), is blanket disposed on the substrate 10 and covers all the gate structures 16.

Figure 3:
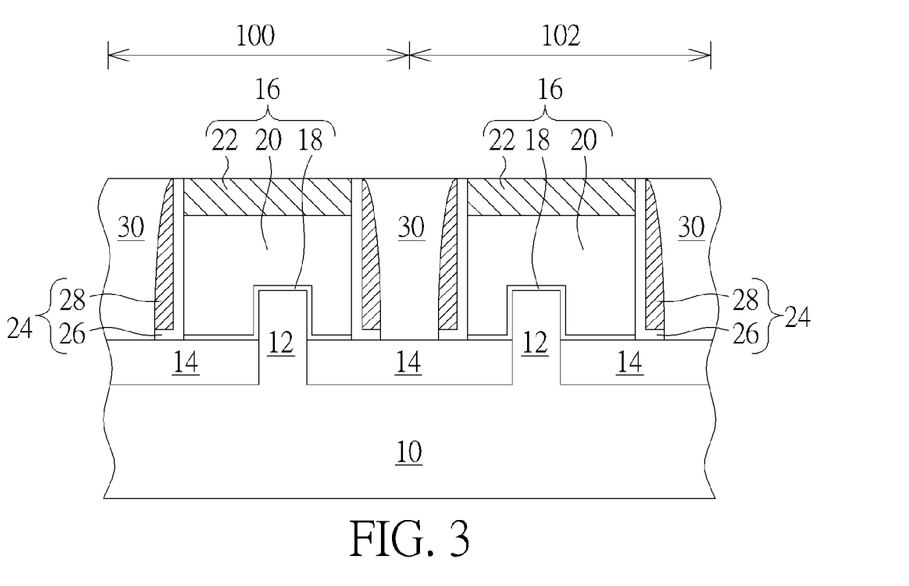
FIG. 3 is a schematic cross-sectional diagram showing a semiconductor device along line A-A' in FIG. 2 after the formation of inter layer dielectric.

The dielectric layer is then planarized through a planarization process, such as chemical mechanical polishing (CMP) to thereby produce a structure shown in FIG. 3. Please refer to FIG. 3 which is a schematic cross-sectional diagram taken along line A-A' in FIG. 2. The fin structures 12 shown in FIG. 3 are disposed on the substrate 10 and may be regarded as protruding from the substrate 10. The lower portions of the fin structures 12 are surrounded by an isolation structure 14, such as a shallow trench isolation (STI), which is used to electrically isolate fin structures 12. The fin structures 12 exposed from the isolation structure 14 may be covered by the gate structures 16. In detail, the two adjacent gate structures 16 are spaced and the dielectric layer 30, such as interlayer dielectric (ILD), is disposed in the space between the adjacent gate structures 16. Particularly, each of the gate structures 16 may have a stack structure composed of interfacial layer 18, dummy gate electrode 20, and hard mask 22. As described in the previous paragraph, the dummy gate electrode 20 may be replaced with the metal gate electrode in the following processing steps in order to obtain a metal gate structure. Preferably, each of the spacers 24 is a stack structure composed of an L-shaped bottom spacer 26 and a top spacer 28, but not limited thereto.

Figure 4:
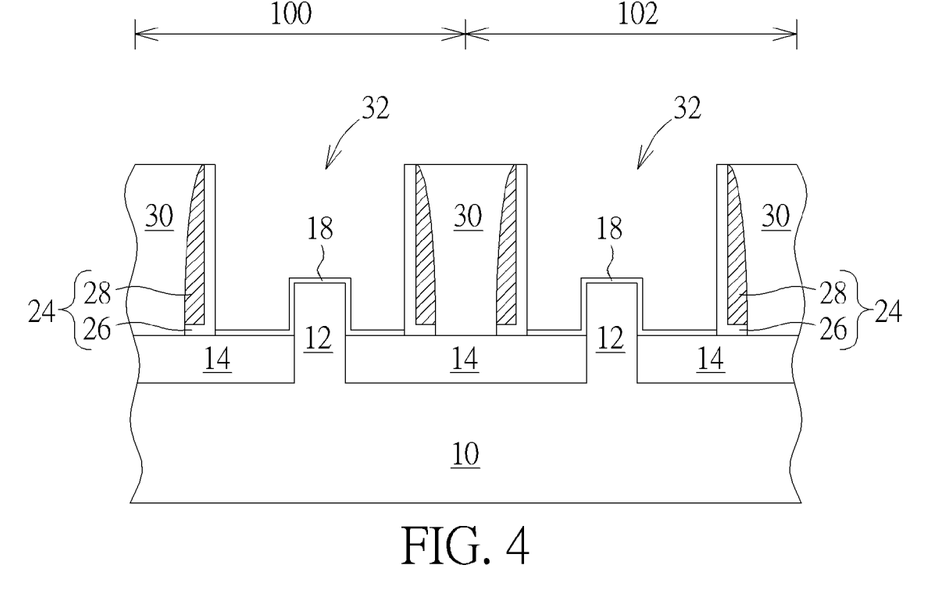
FIG. 4 is a schematic cross-sectional diagram taken along line A-A' in FIG. 2 showing a semiconductor device after the removal of dummy gate electrodes.

Then, a removing process is carried out to remove the dummy gate electrodes 20 and hard masks 22 to thereby form gate trenches 32 as shown in FIG. 4. Please refer to FIG. 4 which is a schematic cross-sectional diagram taken along line A-A' in FIG. 2 showing a semiconductor device after the removal of dummy gate electrodes. At this fabrication stage, the interfacial layer 18 conformally disposed on the fin structures 12 and the interior sidewalls of the spacers 24 may be exposed from the gate trenches 32. Preferably, the removing process described herein may include a two-step etching process for removing the hard masks 22 and the dummy gate electrodes 20, but not limited thereto.

Figure 5:
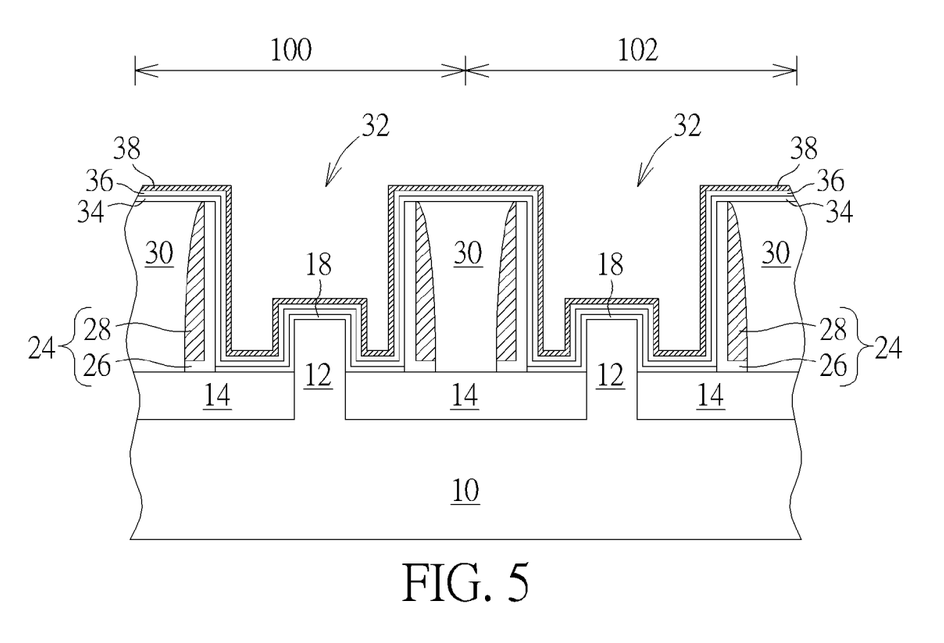
FIG. 5 is a schematic cross-sectional diagram taken along line A-A' in FIG. 2 showing a semiconductor device after the formation of a p-type work function metal layer.

Please refer to FIG. 5. FIG. 5 is a schematic cross-sectional diagram taken along line A-A' in FIG. 2 showing a semiconductor device after the formation of a p-type work function metal layer. After the formation of the gate trenches 32, a high-k gate dielectric layer 34, an etch stop layer 36 and a p-type work function metal layer 38 are sequentially formed on the sidewalls of the gate trenches 32. In this way, the high-k gate dielectric layer 34, the etch stop layer 36 and the p-type work function metal layer 38 may conformally cover the sidewalls of the gate trenches 32. Particularly, the high-k gate dielectric layer 34 may include material selected from the group consisting of as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). Additionally, the p-type work function metal layer 38 may be a single-layered structure or a multi-layered structure, which may be composed of TiN, TaN, titanium carbide (TiC), tantalum carbide (TaC), tungsten carbide (WC), or aluminum titanium nitride (TiAlN), but not limited to this.

In the preceding paragraph, the high-k gate dielectric layer 34 and the etch stop layer 36 are formed after the formation of the gate trenches 32. However, the process of forming the high-k gate dielectric layer 34 and the etch stop layer 36 may be carried out earlier. For example, the high-k gate dielectric layer 34 and the etch stop layer 36 may be formed together with the formation of the gate structures 16 disclosed in FIG. 1. That is to say, they may be parts of the gate structures 16 in this case.

Figure 6:
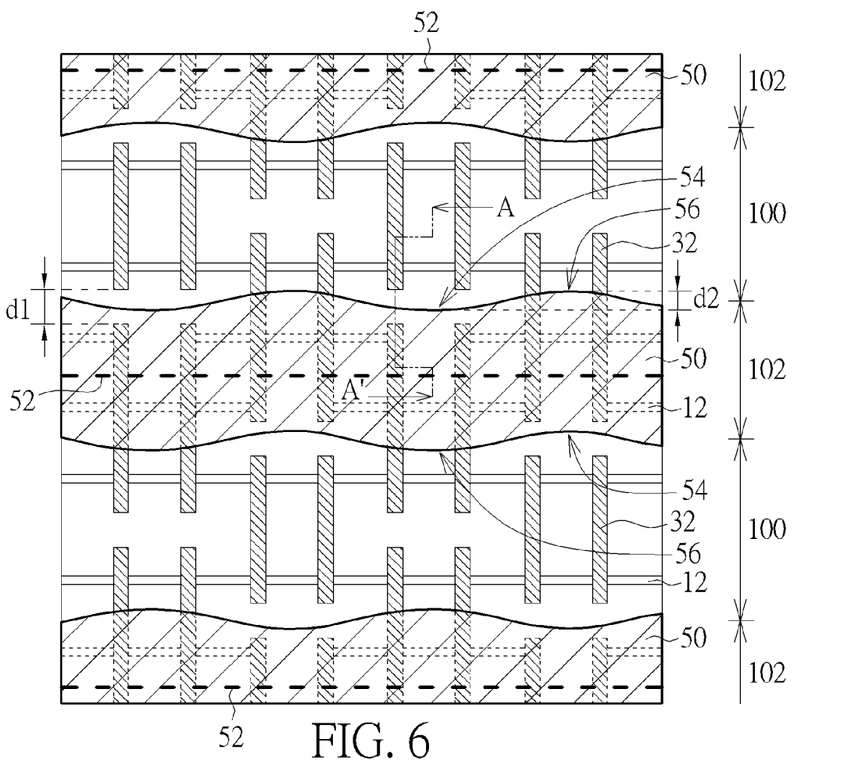
FIG. 6 is a schematic top view showing a semiconductor device covered by serpentine patterns.

Please refer to FIG. 6. FIG. 6 is a schematic top view showing a semiconductor device with serpentine patterns. After the high-k gate dielectric layer 34, the etch stop layer 36 and the p-type work function metal layer 38 are formed in the preceding processing steps, a photolithographic process is carried out to transfer strip-shaped pattern from a photomask (not shown) onto the substrate 10. As a result, at least a serpentine pattern 50 is formed on the substrate 10 and covers the gate trenches 32 in the second region 102. In detail, the serpentine pattern 50 may be a patterned photoresist layer with a centerline 52 along its long axis. The serpentine pattern 50 includes inwardly curved portions 54 shifting towards the centerline 52 and outwardly curved portions 56 shifting outwards the centerline 52. As shown in FIG. 6, the gate trenches 32 in the first region 100 may be exposed from the inwardly curved portions 54 of the serpentine pattern 50. In other words, portions of the interrupted portions of the gate structures overlap with the inwardly curved portions 54 of the serpentine pattern 50. Also, there is a depth d2 between the inwardly curved portions 54 and the outwardly curved portions 56. Preferably, the depth d2 is greater than one-half of the end-to-end distance d1 between two adjacent gate trenches 32.

Figure 7:
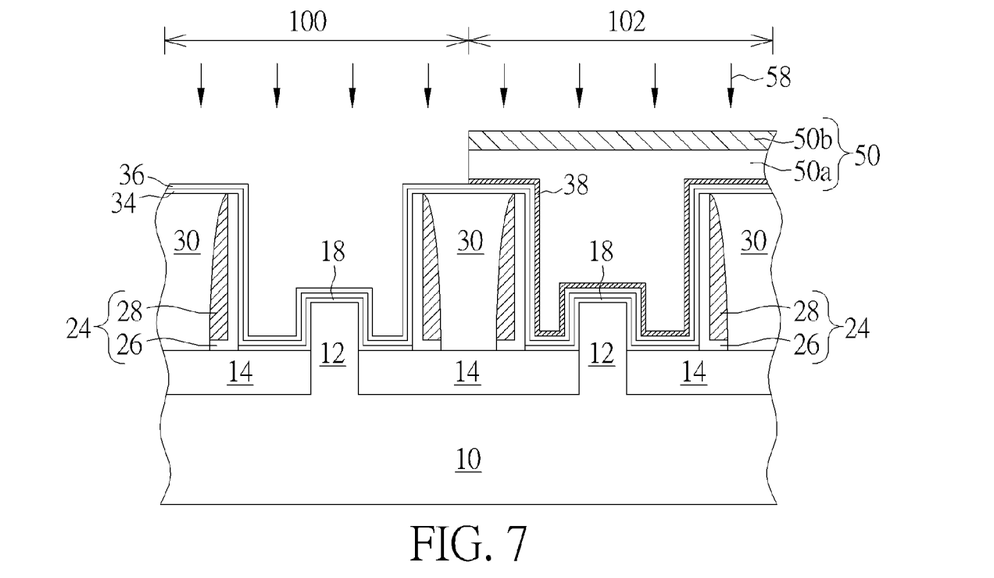
FIG. 7 is a schematic cross-sectional diagram showing a semiconductor device along line A-A' in FIG. 6.

Please refer to FIG. 7. FIG. 7 is a schematic cross-sectional diagram showing a semiconductor device along line A-A' in FIG. 6. The serpentine pattern 50 disclosed above may be a multi-layered structure, such as a double-layered structure composed of an organic dielectric layer (ODL) 50a and a top photoresist layer 50b, but not limited thereto. Then, an etching process 58 is carried out to remove the p-type work function metal layer 38. Because the p-type work function metal layer 38 in the second region 102 is covered by the serpentine pattern 50, only the p-type work function metal layer 38 exposed from the serpentine pattern 50 is removed during the etching process 58.

One feature of the present disclosure is that portions of the serpentine pattern 50 are more away from the ends of the gate trenches 32 in the first region 100 than other portions of the serpentine pattern 50. Particularly, the inwardly curved portions 54 of the serpentine pattern 50 overlap the interrupted portions of the gate structures. In this way, even if there is an alignment mismatch causing the shift of the serpentine pattern 50, a buffer region provided by the inwardly curved portions 54 may be used to reduce influence resulting from this alignment mismatch. Therefore, the p-type work function metal layer 38 disposed in the gate trench 32 in the first region 100 may still be removed completely even if there is an alignment mismatch during the formation of the serpentine pattern 50.

Figure 8:
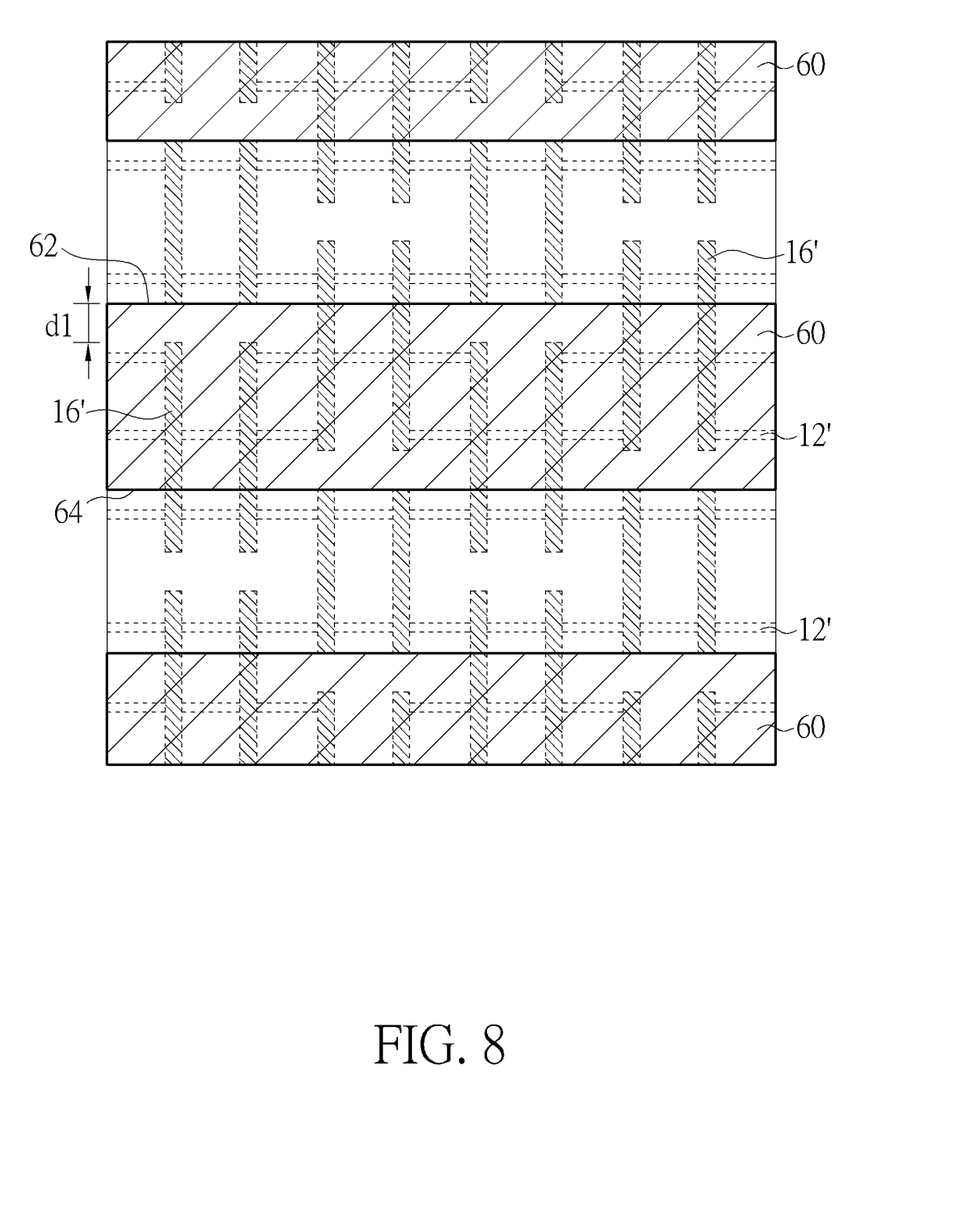
FIG. 8 is a schematic top view showing a mask pattern stored in a computer system.

The method for generating a photomask pattern used to fabricate the serpentine pattern 50 is disclosed in the following paragraphs. Please refer to FIG. 8, FIG. 8 is a schematic top view showing a photomask pattern stored in a computer system. First, a layout pattern corresponding to the layout shown in FIG. 1 is provided to a database of a computer system. The layout pattern stored in the database may at least include fin patterns 12' and gate patterns 16'. Afterwards, stripe-shaped patterns 60 are generated based on the positions of the fin patterns 12' and the gate patterns 16'. As a result, edges 62 and 64 of the stripe-shaped patterns 60 may align with or substantially align with the ends of some of the gate patterns 16'.

Figure 9:
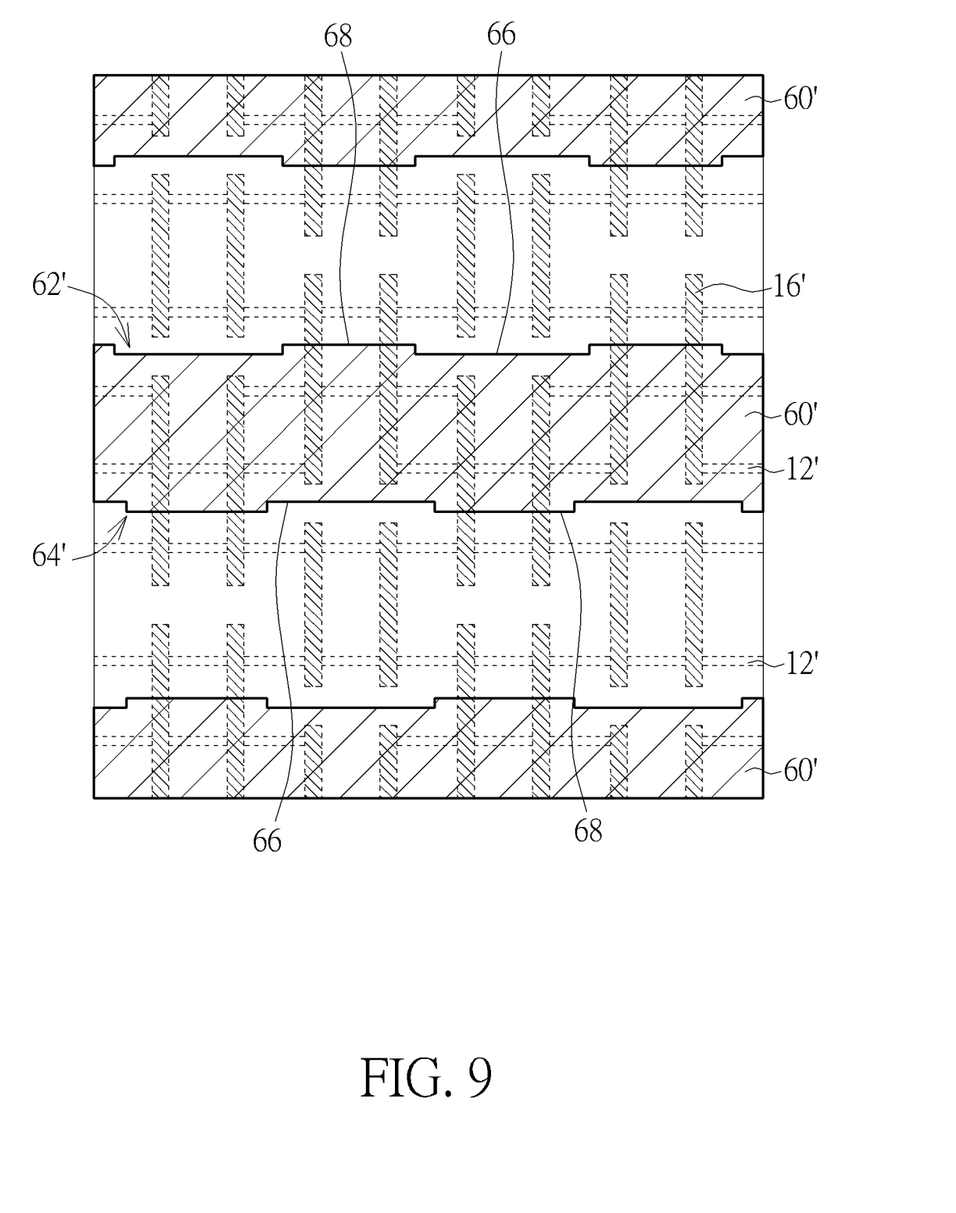
FIG. 9 is a schematic top view showing a corrected mask pattern stored in a computer system.

Please refer to FIG. 9. FIG. 9 is a schematic top view showing a corrected mask pattern stored in a computer system. Then, the contours of the stripe-shaped patterns 60 are modified by technicians or through suitable correction process, such as optical proximity correction (OPC) to generate modified stripe-shaped patterns 60'. Inwardly displaced segments 66 and fixed segments 68 are alternately distributed along edges 62' and 64' of the modified stripe-shaped patterns 60'. Finally, the modified stripe-shaped patterns 60' may be transferred to photomask-making equipment to fabricate the corresponding photomask. The photomask with the modified stripe-shaped patterns is disclosed in the following paragraph.

Figure 10:
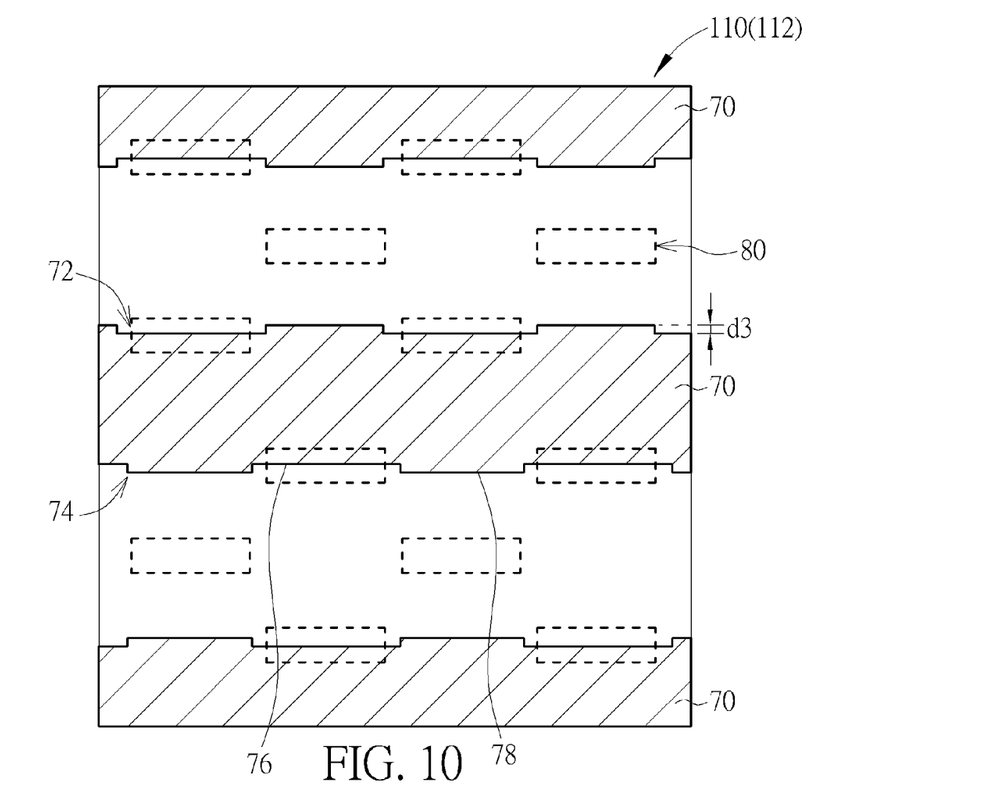
FIG. 10 is a schematic top view of an overlapped mask set.

The mask set for fabricating the geometric patterns and the serpentine pattern is disclosed in the following paragraph. Please refer to FIG. 10. FIG. 10 is a schematic top view of a mask set. The mask set shown in FIG. 10 includes a first mask 110 and a second mask 112, which are respectively used in photolithographic processes to form the opening and the serpentine pattern. In detail, the first mask 110 includes geometric patterns 80 used to fabricate the opening O in FIG. 1. The geometric patterns 80 are alternately disposed with one another and preferably are rectangles. The second mask 112 includes at least a strip-shaped pattern 70 with a centerline along its long axis, which is used to fabricate serpentine pattern in FIG. 6. Particularly, the strip-shaped pattern 70 has a first edge 72 and a second edge 74 opposite to the first edge 72. Inwardly displaced segments 76 and fixed segments 78 are alternately distributed along the first edge and the second edge 74 of the stripe-shaped patterns 70. There is a distance d3 between the inwardly displaced segments 76 and the fixed segments 78. The distance d3 is along an orientation perpendicular to the long axis of the strip-shaped pattern 70 and has a value greater than one-half of a width of the geometric patterns 80. In this way, each of the inwardly displaced segments 76 overlaps each of the geometric patterns 80. In addition, all the inwardly displaced segments 76 have a same length and are spaced apart from the centerline with a same distance.

Figure 11:
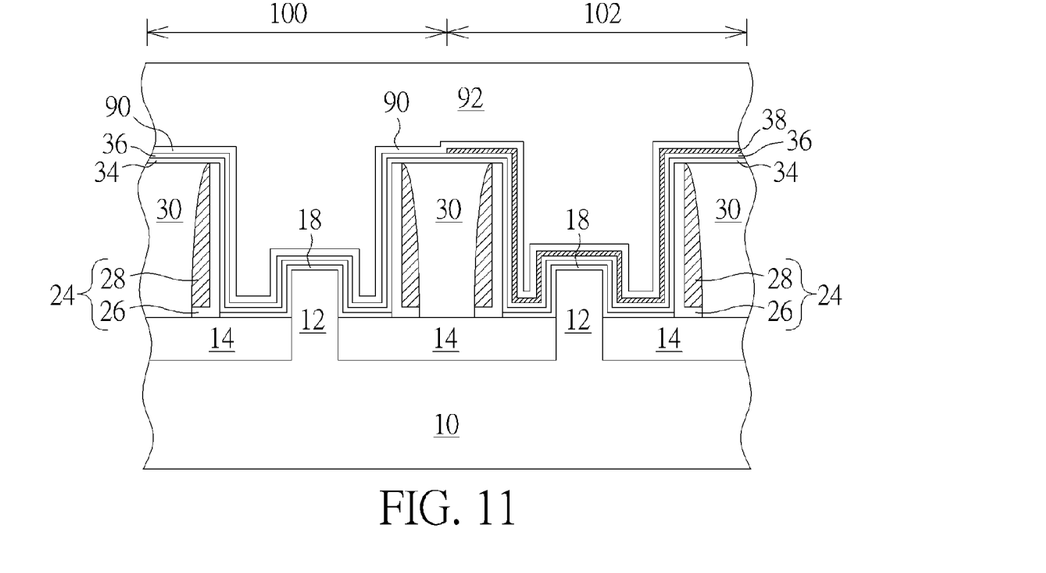
FIG. 11 is a schematic cross-sectional diagram taken along line A-A' in FIG. 6 showing a semiconductor device after the formation of an n-type work function metal layer.

Refer back to the method for fabricating a semiconductor device. After the removal of the p-type work function metal layer exposed from the serpentine pattern, an n-type work function metal layer and a metal layer are sequentially deposited in the gate trenches. This structure is shown in FIG. 11. FIG. 11 is a schematic cross-sectional diagram taken along line A-A' in FIG. 6 showing a semiconductor device after the formation of an n-type work function metal layer. In particular, the n-type work function metal layer 90 is conformally deposited on the sidewalls of the gate trenches 32 in both the first region 100 and the second region 102. The metal layer 92 fills up the gate trenches 32 and covers the dielectric layer 30 between the gate trenches 32. Preferably, the metal layer 92 is composed of materials with low resistance and superior gap-filling characteristic, such as W, Al, TiAl, or titanium aluminum oxide (TiAlO), but not limited to this.

Afterwards, a planarization process is carried out to remove the high-k gate dielectric layer 34, the etch stop layer 36, the p-type work function metal layer 38, the n-type work function metal layer 90 and the metal layer 92 above the top surface of the dielectric layer 30. Subsequently, the high-k gate dielectric layer 34, the etch stop layer 36, the p-type work function metal layer 38, the n-type work function metal layer 90 and the metal layer 92 may be further etched down to a predetermined depth. In this way, the top surface of the metal layer 92 is lower than the top surface of the dielectric layer 30. Finally, a hard mask layer 94 may be filled into the gate trenches 32 to protect the top surface of the metal layer 92. The structure is shown in FIG. 12.

Figure 12:
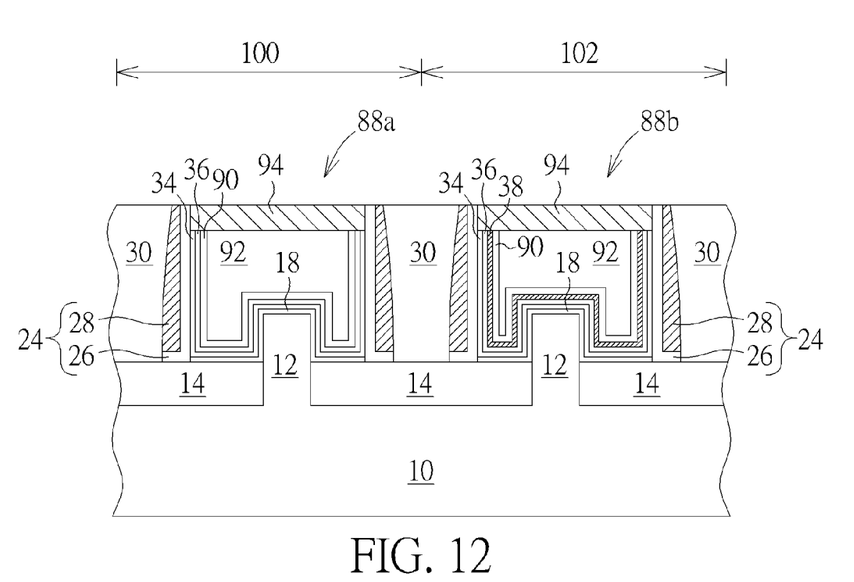
FIG. 12 is a schematic cross-sectional diagram taken along line A-A' in FIG. 6 showing a semiconductor device after the formation of metal gates.

Please refer to FIG. 12. FIG. 12 is a schematic cross-sectional diagram taken along line A-A' in FIG. 6 showing a semiconductor device after the formation of metal gates. Through the preceding fabrication processes, metal gate structures 88a and 88b are respectively formed in the first region 100 and the second region 102. In detail, each of the metal gate structures 88a and 88b at least includes the interfacial layer 18, the high-k gate dielectric layer 34, the etch stop layer 36, the n-type work function metal layer 90, the metal gate electrode 92 and the hard mask 94. The metal gate structures 88b in the second region 102 further includes the p-type work function metal layer 38. Preferably, the metal gate electrodes 92 may be formed through an etching back process and the hard masks 94 may cover the top surfaces of the metal gate electrodes 92.

Figure 13:
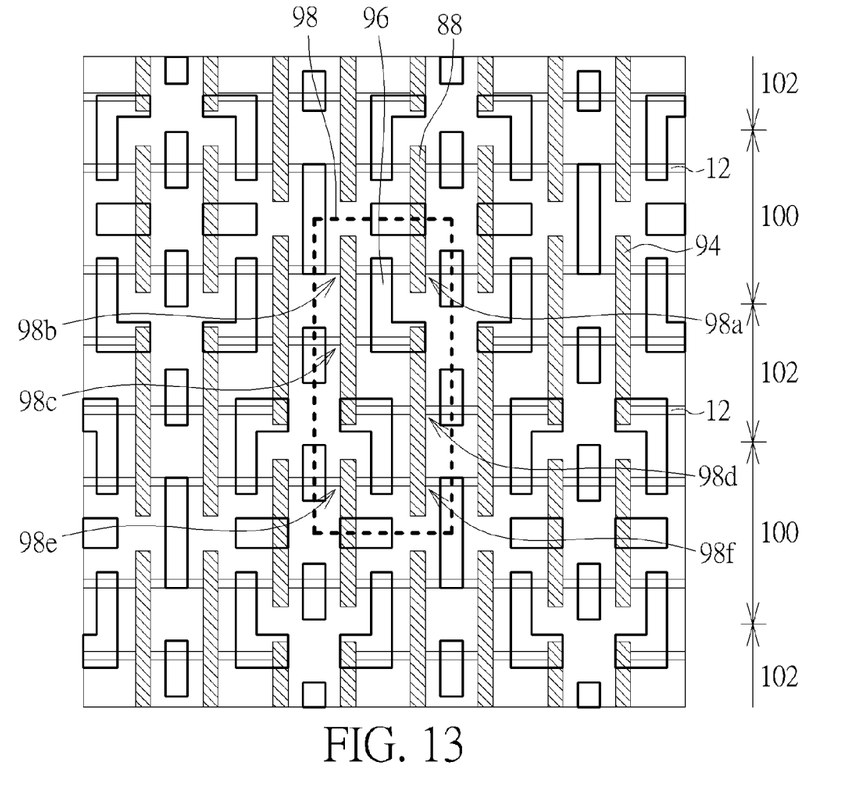
FIG. 13 is a schematic top view showing a semiconductor device after the formation of contacts.

Please refer to FIG. 13. FIG. 13 is a schematic top view showing a semiconductor device after the formation of contacts. After the performance of the replacement metal gate process (RMG) described above, contacts 96 are formed on the substrate 10 and electrically connected to the fin structures 12 and/or the metal gate structures 88 in a proper way. Preferably, at least a 6T-static random access memory (6T-SRAM) cell 98 is fabricated after the formation of the contacts 96, which includes six transistors, such as a first pass gate transistor 98*a*, a first pull-down transistor 98*b*, a first pull-up transistor 98*c*, a second pass gate transistor 98*e*, a second pull-down transistor 98*f*, and a second pull-up transistor 98*d*.

In summary, the embodiments of the present invention disclose a mask set and a fabrication method using the mask set. Portions of a serpentine pattern are more away from the ends of gate trenches in a first region than other portions of the serpentine pattern. Particularly, the inwardly curved portions of the serpentine pattern overlap the interrupted portions of the gate structures. In this way, even if there is an alignment mismatch causing the shift of the serpentine pattern, inwardly curved portions of the serpentine pattern buffer may be used as a buffer to overcome this mismatch. Therefore, a p-type work function metal layer disposed in the gate trench in the first region may still be removed completely even if there is an alignment mismatch after the formation of the serpentine pattern.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A mask set, comprising:
a first mask, comprising a plurality of geometric patterns; and
a second mask, comprising at least a strip-shaped pattern with a first edge and a second edge respectively on opposite sides of the strip-shaped pattern, wherein the strip-shaped pattern has a centerline along a long axis of the strip-shaped pattern, the first and second edges respectively comprise a plurality of inwardly displaced segments shifting towards the centerline, wherein each of the inwardly displaced segments overlaps each of the geometric patterns from a planar view when the second mask is disposed over the first mask.

2. The mask set according to claim 1, wherein the geometric patterns are alternately disposed.

3. The mask set according to claim 1, wherein each of the geometric patterns is rectangle and has a width.

4. The mask set according to claim 1, wherein all the inwardly displaced segments are spaced apart from the centerline with a same distance.

5. The mask set according to claim 1, wherein all the inwardly displaced segments have a same length.

6. The mask set according to claim 1, wherein the first edge further comprising a plurality of fixed segments alternately disposed with the inwardly displaced segments.

7. The mask set according to claim 6, wherein there is a distance between the inwardly displaced segments and the fixed segments adjacent to the inwardly displaced segments, the distance is along an orientation perpendicular to the long axis of the strip-shaped pattern and has a value greater than one-half of a width of the geometric patterns.

8. The mask set according to claim 1, wherein the second edge further comprising a plurality of further fixed segments alternately disposed with the inwardly displaced segments of the second edge.

9. The mask set according to claim 1, wherein there is a distance between the inwardly displaced segments of the second edge and the fixed segments adjacent to the inwardly displaced segments of the second edge, the distance is along an orientation perpendicular to the long axis of the strip-shaped pattern and has a value greater than one-half of a width of the geometric patterns.

10. A method of fabricating a semiconductor device, comprising:
providing a substrate, comprising a plurality of fin structures;
forming a plurality of gate structures crossing the fin structures, wherein ends of the gate structures substantially align with edges of the geometric patterns according to claim 1;
transfer the strip-shaped pattern according to claim 1 onto the substrate to thereby form at least a serpentine pattern on the substrate, wherein the serpentine pattern comprises a plurality of inwardly curved portions and a plurality of outwardly curved portions, the inwardly curved portions are spaced apart from the ends of the gate structures.

11. The method according to claim 10, wherein the gate structures are dummy gate structures and comprise dummy gate electrodes.

12. The method according to claim 11, further comprising removing the dummy gate electrodes to thereby form gate trenches before transferring the strip-shaped pattern.

13. The method according to claim 11, further comprising conformally forming p-type work function metal layer on sidewalls of the gate trenches before transferring the strip-shaped pattern.

14. The method according to claim 11, further comprising removing the p-type work function metal layer exposed from the serpentine pattern after transferring the strip-shaped pattern.

15. The method according to claim 14, further comprising conformally forming n-type work function metal layer on sidewalls of the gate trenches after removing the p-type work function metal layer exposed from the serpentine pattern.

16. The method according to claim 10, wherein the gate structures comprises n-type gate structures and P-type gate structures.

17. The method according to claim 10, wherein there is an end-to-end distance between each of the n-type gate structures and each of the P-type gate structures adjacent to the n-type gate structures.

18. The method according to claim 17, wherein there is a depth between the inwardly curved portions and the outwardly curved portions, the depth is greater than one-half of the end-to-end distance.

19. The method according to claim 10, wherein the semiconductor is a CMOS device.

* * * * *